(12) United States Patent
Liu et al.

(10) Patent No.: US 6,492,096 B1
(45) Date of Patent: Dec. 10, 2002

(54) PATTERNED MOLECULAR SELF-ASSEMBLY

(75) Inventors: Yanjing Liu, Blacksburg, VA (US); Guy A. Schick, Richmond, KY (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 4 days.

(21) Appl. No.: 09/650,747

(22) Filed: Aug. 30, 2000

Related U.S. Application Data

(63) Continuation of application No. 08/974,588, filed on Nov. 19, 1997, now Pat. No. 6,114,099.
(60) Provisional application No. 60/031,349, filed on Nov. 21, 1996.

(51) Int. Cl.[7] .............................. G03F 7/00; B32B 31/00
(52) U.S. Cl. ...................... 430/324; 430/322; 427/258; 427/259; 427/261; 427/264; 427/265; 428/420
(58) Field of Search ................................. 430/322, 324; 427/258, 259, 261, 264, 265; 428/420

(56) References Cited

U.S. PATENT DOCUMENTS 5,208,111 A  *  5/1993  Decher et al. .............. 428/420
5,501,877 A  *  3/1996  Adair et al. ................. 427/249
5,536,573 A  *  7/1996  Rubner et al. .............. 428/378
5,686,549 A  * 11/1997  Grainger et al. ............. 528/25
5,688,642 A  * 11/1997  Chrisey et al. ................. 435/6
5,885,753 A  *  3/1999  Crooks et al. .............. 430/325

* cited by examiner

*Primary Examiner*—Mark F. Huff
*Assistant Examiner*—Nicole Barreca
(74) *Attorney, Agent, or Firm*—Whitham, Curtis & Christofferson, P.C.

(57) ABSTRACT

A patterned molecular self-assembly is provided. The patterned molecular self-assembly comprises a support having an exposed patterned surface and a non-patterned surface. A compound is selectively adsorbed on the exposed patterned surface. The compound may comprise a first compound selectively adsorbed on the exposed patterned surface and a second compound selectively adsorbed on the first compound to form at least one bilayer. The patterned molecular self-assembly may further comprise a first set of bilayers and a second set of bilayers wherein the first set of bilayers has a different composition than the second set of bilayers.

3 Claims, 4 Drawing Sheets

PATTERNED MOLECULAR SELF-ASSEMBLY

CROSS-REFERENCE TO RELATED APPLICATIONS

This application claims the benefit of U.S. Provisional Application No. 60/031,349 filed Nov. 21, 1996, and is a continuation of U.S. Ser. No. 08/974,588 filed Nov. 19, 1997, now U.S. Pat. No. 6,114,099, and each of these application is hereby incorporated by reference in its entirety.

FIELD OF THE INVENTION

This application relates to molecular self-assemblies. In particular, it relates to molecular self-assemblies formed on patterned supports.

BACKGROUND OF THE INVENTION

Self-assembling monolayer (SAM) films have been used as building units for constructing multilayer structures and as modifiers of surface properties. SAMs are prepared by selective adsorption of compounds at solid fluid interfaces to construct organized oriented compact monolayers of good quality and having a thickness ranging from about 1 nanometer to about 3 nanometers. The molecular self-assembly process takes place as a layer-by-layer process, which is based on the spontaneous adsorption of either nonionic polymers, polyanions or polycations from dilute aqueous solutions onto surfaces that carry a functional group or a charge opposite to that of the depositing polymer. Selective adsorption of these polyelectrolytes is alternated to form a bilayer assembly and leads to the formation of multilayer assemblies. The molecules which are typically used for constructing the first monolayer have a terminal polar group and a non-polar functional group at either the other end of the molecule or somewhere within it.

Past patterning techniques using thin films as only passive resists have not provided patterned SAMs with uniform patterns or the high resolution required for potential applications such as full color flat displays, membrane separation, electroluminescent devices, conducting and insulating circuits, optical and nonlinear optical devices, and multi-element chemical sensors. Therefore, it is desirable to prepare uniform and consistently patterned SAMs which may be used to fabricate such devices.

Sagiv in U.S. Pat. No. 4,539,061 provided a method for the chemical modification of a monolayer coated solid surface in order to introduce polar sites for anchoring an additional monolayer on top of an activated monolayer. His method provided a surface with desired surface properties. In this process ordered multilayer assemblies were prepared by direct adsorption of certain types of bifunctional molecules onto suitable solids via a sequence of chemical operations performed on the film coated solid. The key step in the process comprised first forming a monolayer of molecules having a terminal polar group at one end and a non-polar one at the other end of the molecule or at any other position along the molecule. After the first compact monolayer is formed by self-assembly on the solid substrate, the monolayer is activated by introducing polar sites for anchoring an additional monolayer on top of the activated one. The additional monolayer is of similar nature to the first layer. However, it should be noted that these SAMs have inherent limitations which prevent them from being used to build multilayered films. After seven bilayers were formed, further growth or layering of the film was terminated. This occurred because growth of the film required 100% reactivity at each stage in the process. In addition, the SAMs that resulted from this process are not patterned. Instead the SAMs coat the entire surface of the substrate and must later be patterned using etch or other techniques.

Balachander et al. ("Monolayer Transformation by Nucleophilic Substitution: Applications to the Creation of New Monolayer Assemblies", *Langinuir. The ACS Journal of Surfaces and Colloids*, November 1990, volume 6, number 11, pp. 1621–1627) present a series of new trichlorosilyl-terminated surfactants which have been used to create a set of variously functionalized SAM surfaces. Transformations of these surfaces, with a focus on the use of nucleophilic substitution reactions for the creation and interconversion of surfaces with amine- and thiol-containing functionality were reported. These reactions were used to create new surface functionality and bridged monolayer structures. The monolayers were prepared by immersion of the substrate into a beaker containing a long-chain alkyl trichlorosilyl solution. The substrate was then quickly withdrawn from the solution and washed with $CHCl_3$ and water and cleaned in hot $CHCl_3$ in a Soxhlet extractor for 15 minutes. Depending on the surfactant used, the surfaces were transformed into various Y- and Z-terminated surfaces. However, these surface treatments formed only a monolayer structure that covered the entire surface of the substrate.

Decher et al. (U.S. Pat. No. 5,208,111) describe one or more multi-layer elements applied to supports. The elements consist of a modified support having an even surface, in which modification means the application of ions or ionisable compounds of the same charge over the entire area. One or more layers made of organic materials are applied to the support and each layer contains ions of the same charge. The ions of the first layer have the opposite charge of the modified support. In the case of several layers, each further layer has the opposite charge of the previous layer. The layer elements are applied to supports by applying the individual layers from solutions of organic materials. This results in one or more multi-layer elements covering an entire surface of the support. Decher et al. fail to provide a patterned molecular self-assembly nor do they a discuss a method for preparing patterned molecular self-assemblies.

Rubner et al. (U.S. Pat. No. 5,536,573) proposed a molecular self-assembly of electrically conductive polymers. Their process is driven by the attractions developed between a positively charged p-type doped conducting polymer and a negatively charged polyion or water soluble, nonionic polymer. Like Decher et al., they fail to disclose a patterned molecular self-assembly or process for preparing patterned molecular self-assemblies.

Chan et al. ("Polymeric Self-Assembled Monolayers, 3, Pattern Transfer by Use of Photolithography, Electrochemical Methods, and an Ultrathin Self-Assembled Diacetylenic Resist", *Journal of the American Chemical Society*, 1995, volume 117, pp. 5875–5876) disclose that a substrate can be patterned using a diacetylenic, self-assembled monolayer (SAM) resist and photolithographic and electrochemical methods. In this instance, the diacetylenic SAM is used as a negative photoresist wherein the image of a transmission electron microscope (TEM) minigrid is transferred into a gold (Au) substrate. In their process, a SAM composed of close-packed $HS-(CH_2)_{10}C{\equiv}CC{\equiv}C(CH_2)_{10}COOH$ molecules is placed on an unpatterned Au/Cr/Si surface. A minigrid is placed in contact with the SAM to form an assembly. The entire assembly is then exposed to UV light, which induces polymerization in the unmasked regions of the SAM. Next, the unpolymerized portion of the SAM resist is selectively desorbed using an electrochemical reductive stripping method. Selective stripping is possible because the polymeric SAM is sufficiently insoluble and strongly bound to the surface through multiple Au/S and van der Waals interactions that it survives potential excursions that remove monomeric organomercaptan SAMs. Resist removal results in a negative image of the mask, which can be elaborated by etching the grid image into the Au surface with an oxygen saturated 1 M KOH plus 10 mM KCN aqueous solution. In this particular method, the entire substrate is first coated with a monolayer film and then the monolayer film is removed and later etched to leave the negative image of the mask. However, it was found that the lateral dimensions of the hexagonal regions formed by this process were found to be somewhat less than those of the original mask.

Hammond ("New method makes patterned polymer films"; *Chemical and Engineering News*, Oct. 6, 1997) proposed a way to control the adsorption process horizontally and vertically. In her method, substrates are prepared using a microcontact printing technique. In this process a "rubber stamp" containing a pattern is "inked" with 16-mercaptohexadecanoic acid and pressed onto a gold-coated silicon substrate. The stamping process imprints the gold substrate with lines of the carboxylic acid functionality. The imprinted substrate is then immersed in a solution of oligo-(ethylene glycol)-terminated alkanethiol to cover the gold regions left exposed. The now-patterned gold surface serves as a molecular template for polyions. In this process, the pattern is established on the previously treated areas of the surface instead of the exposed surface of the support. The problem with this technique is that the surface must be completely inked before the assembly is prepared. As with many rubber stamping processes, the chance of the "ink" not covering the whole stamp is great, thus the ability to provide uniform and repeated patterns in manufacturing is greatly reduced.

Adair et al. (U.S. Pat. No. 5,501,877) propose a method for creating patterned films on substrates. The method comprises creating a photomask pattern on the substrate, adsorbing seed particles of the film material from a colloidal suspension on the substrate, followed by chemical vapor deposition (CVD) to create a thin film on the selected areas. This method is applicable to high surface energy material capable of film formation through CVD techniques on a substrate. Adair et al. fail to mention the application of this process to molecular self-assemblies. In fact, this technique is to be used with CVD which is a much different technique than molecular self-assembly technique. The CVD technique will not produce the high resolution patterns required for many of the previously mentioned applications. Nor will it give a uniform, pin-hole free film. In addition, the thickness of the films from the CVD technique is limited to a few hundred nanometers.

An object of the present invention is to provide a uniform, patterned molecular self-assembly.

Another object of the present invention is to provide a uniform, multi-patterned molecular self-assembly.

Another object of the present invention is to provide a process for preparing a uniform, patterned molecular self-assembly where the pattern is made by selectively adsorbing the molecular self-assembly onto an exposed surface of a support.

A further object of the present invention is to provide a process for preparing a uniform, multi-patterned molecular self-assembly where two different patterns are selectively adsorbed onto exposed surfaces of a support.

SUMMARY OF THE INVENTION

By the present invention, a uniform, patterned molecular self-assembly is provided. The assembly comprises a support having an exposed patterned surface and a non-patterned surface. A compound is selectively adsorbed onto the exposed patterned surface. The compound may comprise a first compound selectively adsorbed on the exposed patterned surface of the support and a second compound selectively adsorbed on the first compound to form at least one bilayer. The patterned molecular self-assembly may further comprise a first set of bilayers and a second set of bilayers wherein the first set of bilayers has a different composition than the second set of bilayers.

When preparing the patterned molecular self assembly, a support having a surface is provided. The support is patterned wherein a portion of the surface of the support is exposed. A first compound is selectively adsorbed on the exposed surface of the support and a second compound is selectively adsorbed on the first compound to form a patterned molecular self-assembly.

The patterned molecular self-assemblies of the present invention are uniform, better defined, and have a higher resolution than the molecular self-assemblies made following the current techniques. Moreover, the process for preparing the patterned molecular self-assemblies makes it easier to make uniform patterned molecular assemblies. The patterning techniques do not require etching which may damage the layers, or stamping which may lead to uneven application of the film.

Additional objects and advantages of the invention will be set forth in part in the description which follows, and in part will be obvious from the description, or may be learned by practice of the invention. The objects and the advantages of the invention will be obtained by means of instrumentalities in combinations particularly pointed out in the appended claims.

BRIEF DESCRIPTION OF THE DRAWINGS

The accompanying drawings illustrate a complete embodiment of the invention according to the best modes so far devised for the practical application of the principles thereof, and in which.

DETAILED DESCRIPTION OF THE PREFERRED EMBODIMENTS

Figure 1:
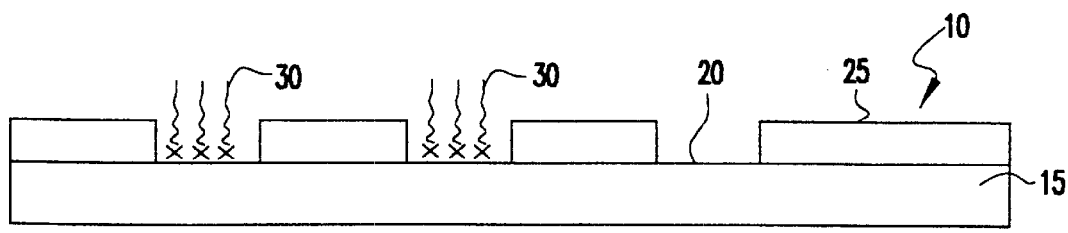
FIG. 1 is a schematic representation of the patterned molecular self-assembly having a compound selectively adsorbed on the exposed patterned surface.

Referring now to the figures where like numbers are assigned to like elements. FIG. 1 depicts a patterned molecular self assembly 10 having a support 15 which has an exposed patterned surface 20 and an unexposed, non-patterned surface 25. For purposes of this specification and the appended claims, an exposed patterned surface is defined as a portion of the support which has its natural surface showing or wherein the surface of the support is not covered by another substance. The support may be any shape or material known to those skilled in the art and in particular has a flat surface and is prepared from a material selected from the group consisting of: single crystal silicon, silica, plastic, composite, ceramic or metal. Preferably, the support is single crystal silicon. FIG. 1 further depicts a compound 30 which has been selectively adsorbed on the exposed patterned surface 20 of the support 15. Selective adsorption takes place when a particular compound comes in contact with either the substrate or another compound such that an ionic, covalent or hydrogen (electrostatic) bond is formed between the two. When selective adsorption occurs between the compound and the substrate, a monolayer having a thickness ranging from about 1 nanometer to about 3 nanometers is formed.

The compound which is selectively adsorbed on the exposed patterned surface or used to form the molecular assemblies may be any compound known to those skilled in the art provided it is not a high surface energy material. For example, the compound may be capable of forming an ionic bond and may be either anionic or cationic. In addition, the compound may be capable of forming a covalent bond or is nonionic, or undergoes electrostatic bonding by sharing an electron such as in hydrogen bonding. These types of materials are described in U.S. Pat. No. 4,539,0061 to Sagiv, U.S. Pat. No. 5,208,111 to Decher et al., and U.S. Pat. No. 5,536,573 to Rubner et al. the specifications of each are hereby incorporated by reference in their entirety.

Figure 2:
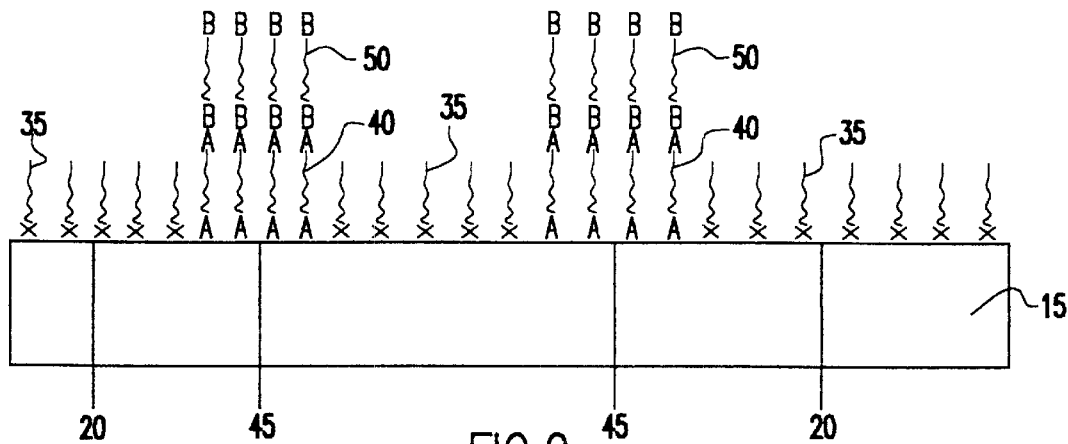
FIG. 2 is a schematic representation of the patterned molecular self-assembly having a first compound and a second compound selectively adsorbed on the exposed patterned surface.

FIG. 2 depicts one patterning technique of the present invention. In this process, an inert or unreactive compound 35 is first selectively adsorbed on the exposed patterned surface 20 of the support 15. Next, the non-patterned surface of the support is exposed and a first compound 40 is selectively adsorbed on the newly exposed patterned surface of the support 45. The new pattern is formed between the inert compound 35 which remains on or covers the surface of the support. A second compound 50 is selectively adsorbed on the first compound 40 to form a bilayer. Many layers may be formed by continuing the selective adsorption of the first and second compounds and these layers may range from 1 bilayer to 10,000 bilayers depending on the final application. Selective adsorption does not take place where the inert compound 35 has been adsorbed on the support 15.

Figure 3:
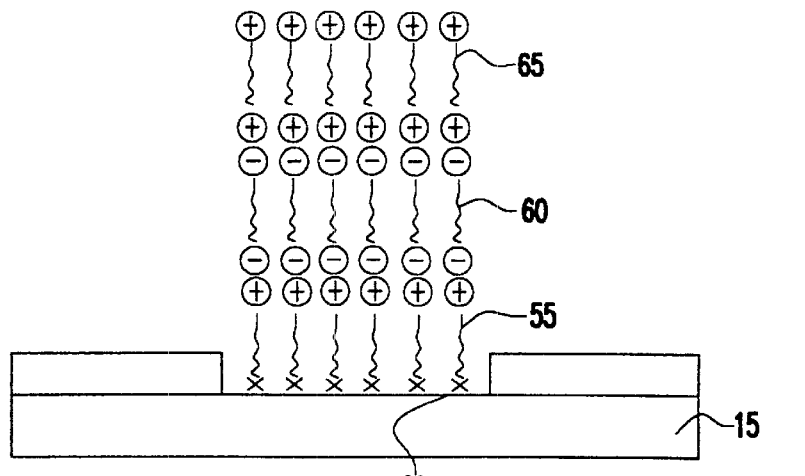
FIG. 3 is a schematic representation of the patterned molecular self-assembly having a plurality of layers selectively adsorbed on the exposed patterned surface.

FIG. 3 shows another form of patterning where a compound 55 is selectively adsorbed on the exposed patterned surface 20 of the support 15 to form a monolayer. The compound 55 has a functional group which, as shown, is capable of forming an ionic bond however, the bonds may also be covalent or electrostatic. A first compound 60 is selectively adsorbed on the compound 55 and a second compound 65 is selectively adsorbed on the first compound 60 to form at least one bilayer. Selective adsorption of the first compound 60 and the second compound 65 may continue to form a plurality of layers up to about 10,000 bilayers.

Figure 4:
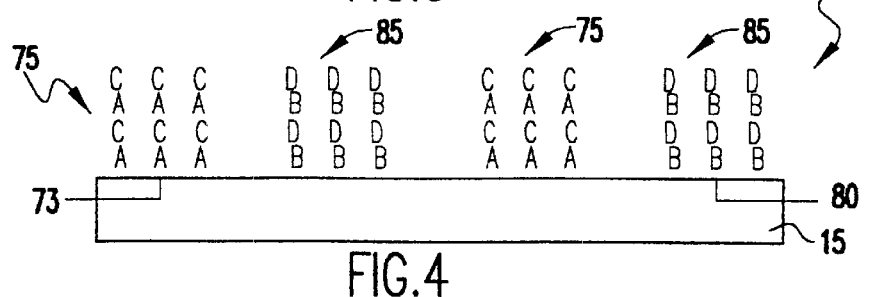
FIG. 4 is a schematic representation of the multi-patterned molecular self-assembly having a plurality of layers selectively adsorbed on the exposed patterned surface.

FIG. 4 depicts a multi-patterned molecular self-assembly 70 where the bilayers are formed by different compounds. In this instance, a first set of layers 75 are selectively adsorbed on a first exposed patterned surface 73 of the support 15 and a second set of layers 85 are selectively adsorbed on a second exposed patterned surface 80. Each set of layers ranges in thickness from 1 bilayer to about 10,000 bilayers. The composition of the first set of layers 75 is different from the composition of the second set of layers 85.

Figure 5:
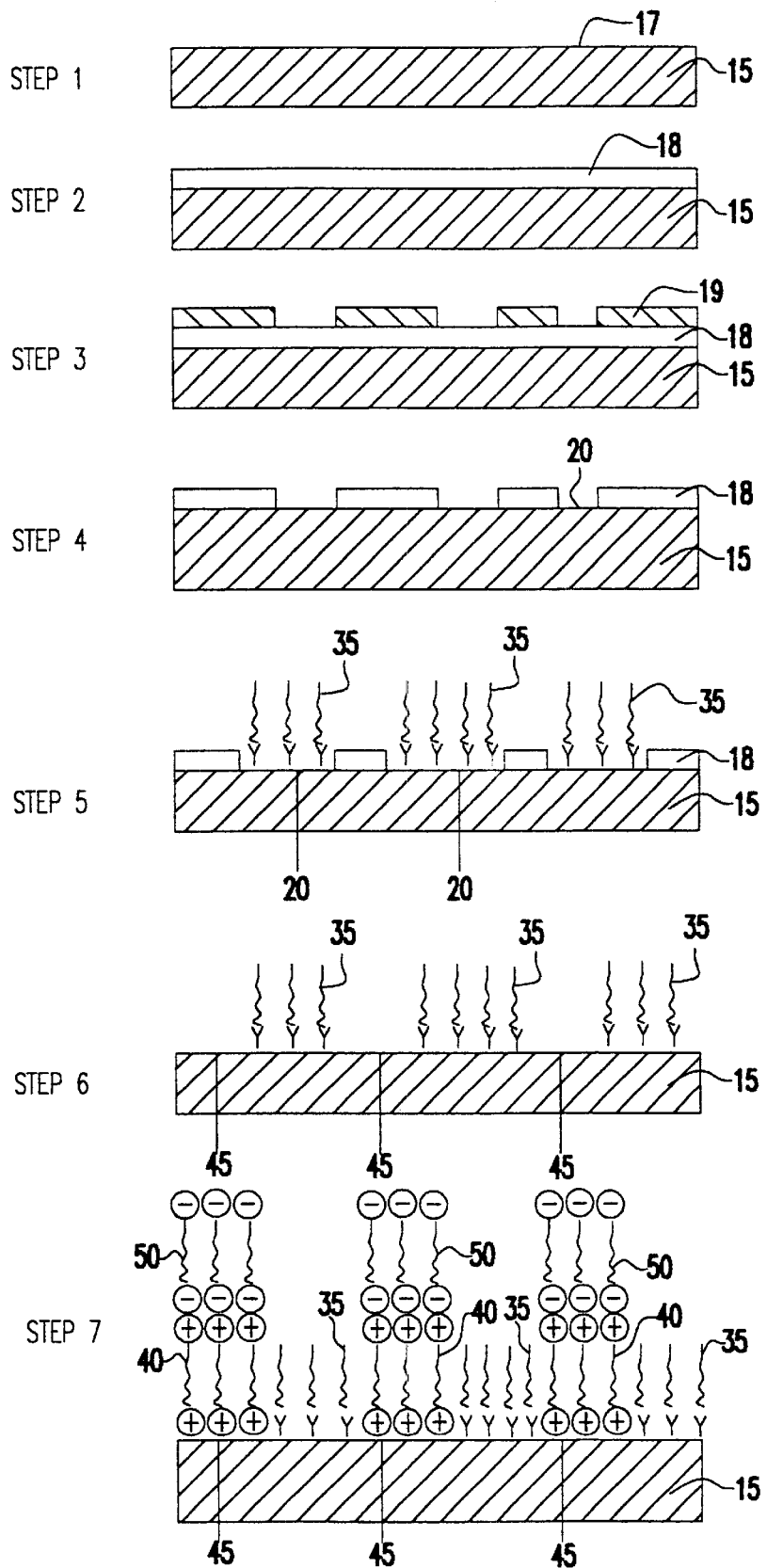
FIG. 5 is a schematic representation of a first embodiment of the process for preparing the patterned molecular self-assembly of the present invention.

FIG. 5 shows a process embodiment of the present invention. In general, a support 15 having a surface 17, is provided. The support 15 is patterned. Patterning may take place by applying a resist 18 to the support. The resist may be either an electron resist or a photoresist but is preferably a photoresist. The support 15 which is covered with resist 18 is then masked 19 and exposed to activate the resist 18. Activation of the resist may take place by exposing the resist to: ultraviolet light, electrons, x-rays, electromagnetic fields, an acoustic source, a thermal source, a chemical source, a plasma source, and ion bombing sources depending on the sensitivity of the resist. In the case of photoresist, the resist is exposed to ultraviolet light leaving an exposed patterned surface 20 on the support 15. FIG. 5 shows an inert compound 35 is selectively adsorbed on the exposed surface 20 of the patterned support 15. The resist 18 is removed and the inert compound 35 remains on the support 15 to provide a second patterned surface 45. A first compound 40 is selectively adsorbed on the second patterned surface 45. A second compound 50 is then selectively adsorbed on the first compound 40 to form a bilayer. The first compound 40 and the second compound 50 may be repeatedly adsorbed to form a multi-layered patterned molecular self-assembly having a thickness ranging from about 1 bilayer to about 10,000 bilayers.

Figure 6:
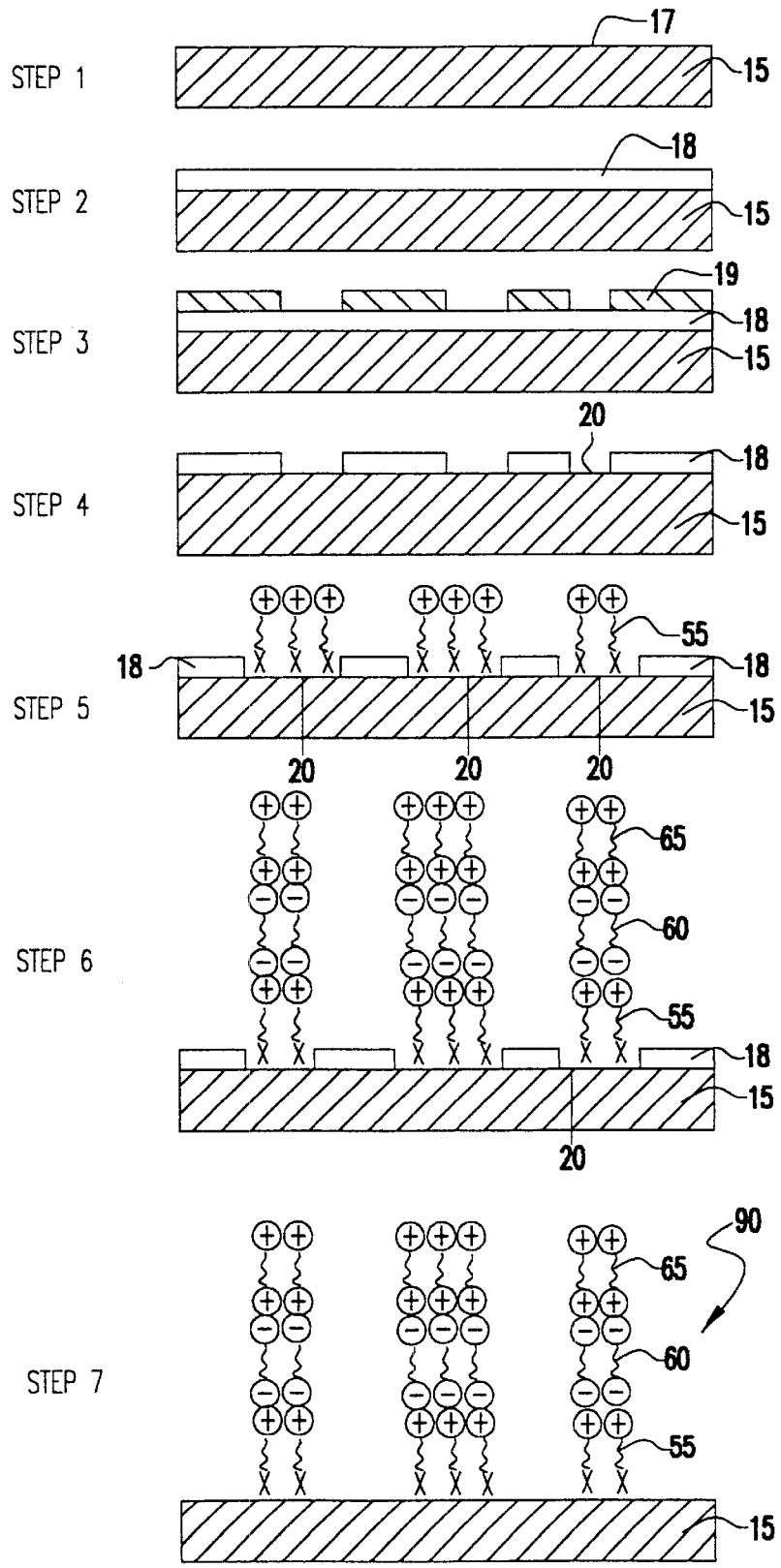
FIG. 6 is a schematic representation of a second embodiment of the process for preparing the patterned molecular self-assembly of the present invention.

FIG. 6 depicts another process for preparing the molecular self-assemblies of the present invention. The process is similar to that shown in FIG. 5, however, it does not involve the selective adsorption of an inert compound. In this process, a compound 55 is applied to the exposed patterned surface of the support 20. This compound may be used to apply a charge or surface active group to the support. Note that the resist 18 still remains on the support 15. A first compound 60 is selectively adsorbed on the compound 55 which has been applied to the exposed surface of the support 20. Next, a second compound 65 is selectively adsorbed on the first compound 60 to form a bilayer. The process may be repeated to form a multi-layered molecular self-assembly. Lastly, the resist 18 is removed, leaving the patterned molecular self-assembly 90 remaining on the support 15.

Figure 7:
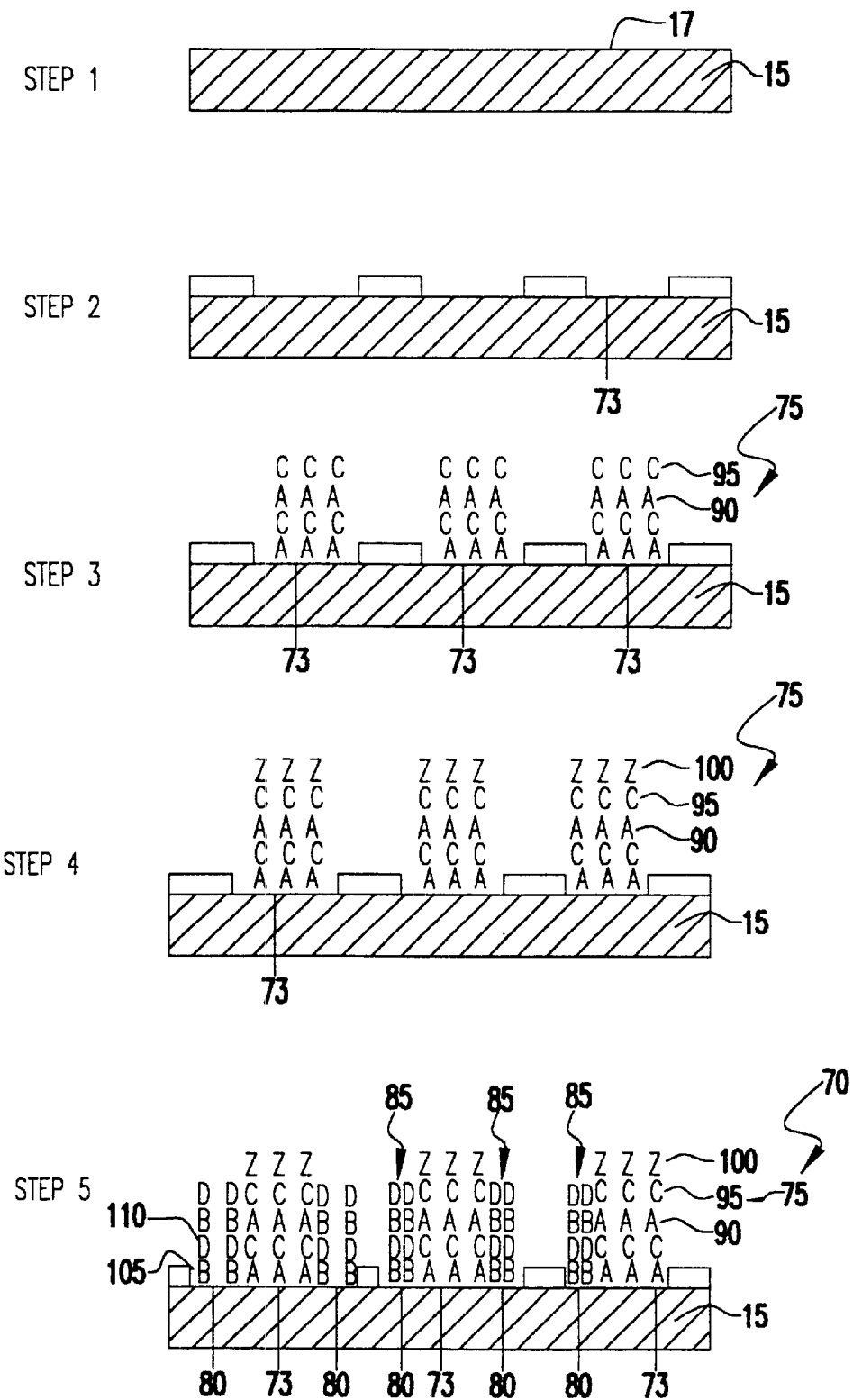
FIG. 7 is a schematic representation of a third embodiment of the process for preparing a multi-patterned molecular self-assembly.

FIG. 7 shows how a multi-patterned molecular self-assembly 70 is prepared. This process involves providing a support 15 having a surface 17. A first pattern is formed on the support 15 which causes a first portion 73 of the surface of the support to be exposed. A first compound 90 is selectively adsorbed on the first exposed portion of the surface of the support 73 and a second compound 95 is selectively adsorbed on the first compound 90 to form a first bilayer 75. Selective adsorption may continue, to build up the first bilayers to a thickness ranging from about 1 bilayer to about 10,000 bilayers. An inert compound 100 is applied to the first set of bilayers. The inert compound is one which acts as a capper or blocks further growth at the site. Such an inert compound is usually monofunctional wherein one end of the compound reacts with the reactive group on the bilayer and the other end of the compound is unreactive. An examples of an inert compound is one having the structural formula:

$$CH_3-(CH_2)_x-R$$

where x=5–30

R is a reactive functional group which is either nonionic, anionic, or cationic.

Next, the support is patterned a second time to expose a second portion of the surface of the support 80. This is accomplished by masking a different portion of the support and exposing it a second time. A third compound 105 is then selectively adsorbed on the exposed second portion of the surface of the support 80 and a fourth compound 110 is selectively adsorbed on the third compound 105 to form a second bilayer 85. As was done with the first layer, selective adsorption may continue, to build up a second bilayer having a thickness ranging from about 1 bilayer to about 10,000 bilayers.

The ability to control the patterning and the thickness of the bilayers make the process and products described herein particularly useful for many applications. In particular, these patterned molecular self-assemblies are useful for optical, luminescent and electronic applications where high resolution, multi-pixel structures and uniform film thickness is required.

EXAMPLES

Example 1

A patterned molecular self-assembly was prepared following the process shown in FIG. 5. A single crystal silicon support was provided. The photoresist known as Photoresist Microposit 1450 J, which is commercially available from the company, Shipley in Pennsylvania, was applied to the support. Next, a mask was applied to the support which had been treated with the photoresist. The masked substrate was exposed to an ultraviolet light source. The photoresist was developed and the exposed portion rinsed off to yield a pattern or open area on the support with the remainder of the support being covered with photoresist. An inert compound was deposited through chemisorption onto the open area on the substrate. This was done by dipping the support into a reactive oligomeric solution having the formulas:

$$CH_3(CH_2)_x-Si-(O\ R)_3$$

where

R=CH$_3$—, —CH$_2$—CH$_3$ x=2–30.

and $$CH_3(CH_2)_x-Si-Cl_3$$

where x=2–30 and preferably was either octadecyltrichlorosilane (OTS) which is commercially available from Huls America, Inc; heptadecyltrichlorosilane which is commercially available from Fluke; or hexadecyltrichlorosilane which is also commercially available from Fluke. The support was rinsed with a solvent such as toluene, water or acetone to strip the remaining photoresist. A first compound was applied to the support by dipping the support into an oligomeric solution and then rinsing with a solvent. The oligomer is terminated by an ionic group such as a negatively charged sulfonate (Poly(sodium 4-styrenesulfonate) (PSS)) or a positively charged ammonium (Poly(allylamine hydrochloride), PAH). Then, an ionic self-assembly process was employed by dipping the support into a second compound solution to yield a multi-layered SAM by alternating deposition of polyionic materials onto the charged areas.

One advantage to this process is that the final product can be much thinner or thicker than what has been produced in the past. The pattern of the film had a very high resolution (from nanometer to micrometer) and the thickness ranges from 1 bilayer to about 10,000 bilayers. In addition, strong electrostatic attraction exists between the layers of the film to yield a completely even coating. This is especially beneficial for those applications where there is a need to have an even coat or where it is necessary to build patterned heterostructure thin films with complex molecular architectures and thicknesses that are controllable at the molecular level.

Example 2

The process depicted in FIG. 6 was employed to produced patterned molecular assemblies directly on the support surface. In this process, masked UV irradiation of photoresist produced patterns of bare silicon surrounded by photoresist. The multi-layer ionic polymer films were deposited by the self-assembly process described in Example 1 onto the bare hydroxy silicon surface and the regions of photoresist. After the buildup of the films, the photoresist was removed by chemical washing.

Example 3

A similar process to that shown in FIG. 6 was employed to form a different molecular self-assembly. In this process, when the bare silicon surfaces were patterned by removal of the photoresist, N-2-aminopropyltrimethoxysilane (APS) molecules, which is commercially available from Huls America, Inc., were covalently bonded to the bare round regions by a self-assembly process. The substrate was then rinsed in an acidic aqueous solution so that the amino groups of APS were protonated and the regions became positively charged. Here, the layer-by-layer polyion build up was initiated by deposition of PSS/PAH and continued as described in Example 2.

Example 4

Multi-patterned, multilayer films were patterned with polycation and polyanion molecules by employing an inert capping agent as shown in FIG. 7. A first film was assembled as described in Example 1. In order to deposit a second film in neighboring regions to the first film, a capping agent, dodecyltrimethylammonium bromide (DTAB), was introduced on top of the pre-existing polyion multilayer through ionic attraction. The DTAB blocked the further growth of the second set of layers on the sites of the first set of layers. The second set of layers was assembled using a different set of compounds that those of the first film layer. Molecular assembly of the second set of layers took place as described in Example 1.

Example 5

Scanning electron microscopy (SEM) was used to confirm the patterns of polymer films and to study the surface morphology, domains, pinholes and defects of the SAMs. The patterned surface was examined using an ISI SX-40 scanning electron microscope. The samples were sputter-coated with approximately 30–40 nm of gold to prevent surface charging by the electron beam. The samples were mounted onto the sample holder using double-sided tape. Two drops of silver paint were employed to make an electrical connection between the aluminum mount and the gold-coated surface, so that excess surface charge could be dissipated.

The SEM image of the SAM prepared according to the process of Example 1 showed that there was a distinct contrast observed between the round alkylated regions and their surrounding polymer multilayers. The area of a given round region was about $2.1 \times 10^{-4}$ cm$^2$. These regions contain only alkane (OTS) chains bound to was about $2.1 \times 10^{-4}$ cm$^2$. These regions contain only alkane (OTS) chains bound to the underlying surface. Only weak interactions occur between OTS and PSS or PAH, so frequent washing with water prevented any buildup of material on the OTS surface. Therefore, only a monolayer of OTS was seen in the round areas.

The multilayer regions consisting of 29 patterned bilayers of polyanion/polycation were prepared by consecutive adsorption steps of PSS and PAH. Ellipsometry measurements indicated that the average thickness of a bilayer of PSS and PAH was about 1.28 nm. The thickness of the total ionic polymer film was 37.12 nm. The ionic polymer molecules selectively deposited on the charged regions. A distinct contrast difference was observed between the round film regions and their surrounding bare silica area. The area of a given round region was about $2.1 \times 10^{-4}$ cm$^2$.

Fifty (50) bilayers of PAH/PSS films with a thickness of about 64 nm were deposited onto these round regions by consecutive adsorption steps of PSS and PAH. The ionic polymer molecules were found to have selectively deposited into the charged regions as was indicated by the distinct convex shapes of the round regions.

A similar patterning process was observed where the bare silicon surfaces were patterned by removal of the photoresist. N-2-aminopropyl-trimethoxysilane (APS) molecules were covalently bonded to the bare round regions by a self-assembly process. The substrate was then immersed in an acidic aqueous solution so that the amino groups of APS were protonated and the regions became positively charged. The layer-by-layer polyion build-up was initiated by deposition of PSS to form a pattern of 50 bilayer columns of PSS/PAH.

The above description and drawings are only illustrative of preferred embodiments which achieve the objects, features and advantages of the present invention, and it is not intended that the present invention be limited thereto. Any modification of the present invention which comes within the spirit and scope of the following claims is considered part of the present invention.

What is claimed is:

1. A process for preparing an article coated with multiple bilayers which adhere to one another by ionic attraction and where said multiple bilayers create a desired pattern on a surface of said article, comprising the steps of:

patterning said surface of said article to produce exposed surfaces and unexposed surfaces;

selectively absorbing a first compound on said exposed surfaces of said article;

exposing said unexposed surfaces of said article, said first compound remaining absorbed on said article during said exposing step, said exposing step producing newly exposed surfaces;

absorbing a second compound to said newly exposed surfaces, said second compound having a portion which extends from said newly exposed surfaces which will form an ionic bond; and forming a first patterned multiple bilayer by repetitively ionically bonding multiple layers of at least two compounds on top of said second compound.

2. A process for preparing an article coated with multiple bilayers which adhere to one another by ionic attraction and where said multiple bilayers create a desired pattern on a surface of said article, comprising the steps of:

patterning said surface of said article to produce exposed surfaces and unexposed surfaces;

selectively absorbing a first compound on said exposed surfaces of said article, said first compound having a portion which extends from said exposed surfaces which will form an ionic bond; and forming a first patterned multiple bilayer by repetitively ionically bonding multiple layers of at least two compounds on top of said first compound.

3. The process of claim 2 further comprising the step of exposing said unexposed surfaces to produce newly exposed surfaces.

* * * * *